United States Patent [19]
Nakanishi et al.

[11] Patent Number: 5,579,184
[45] Date of Patent: Nov. 26, 1996

[54] PLAYBACK CLOCK SIGNAL GENERATING CIRCUIT WHICH USES A FIRST AND SECOND PHASE LOCK LOOP

[75] Inventors: Shuichi Nakanishi; Shinichi Kitahara, both of Tokyo, Japan

[73] Assignee: NEC Corporation, Tokyo, Japan

[21] Appl. No.: 261,120

[22] Filed: Jun. 14, 1994

[30] Foreign Application Priority Data

Jun. 17, 1993 [JP] Japan .................................. 5-145300
Feb. 14, 1994 [JP] Japan .................................. 6-017091

[51] Int. Cl.$^6$ ........................................................ G11B 5/09
[52] U.S. Cl. ............................................................ 360/51
[58] Field of Search ........................... 360/46, 51; 369/59

[56] References Cited

U.S. PATENT DOCUMENTS

| | | | |
|---|---|---|---|
| 4,918,677 | 4/1990 | Ashinuma et al. | 369/32 |
| 5,258,877 | 11/1993 | Leake et al. | 360/51 |
| 5,327,302 | 7/1994 | Khoury et al. | 360/51 |
| 5,341,249 | 8/1994 | Abbott et al. | 360/51 |

FOREIGN PATENT DOCUMENTS

61-175968  8/1986  Japan .

Primary Examiner—W. Chris Kim
Attorney, Agent, or Firm—Foley & Lardner

[57] ABSTRACT

A playback clock signal generating circuit has first and second phase-locked loops PLLs. The first PLL has a voltage-controlled oscillator VCO controllable by an output signal from a low-pass filter for outputting a signal, a variable frequency divider for varying a frequency-dividing number depending on head position information and frequency-dividing the signal from the VCO with the varied frequency-dividing number, a reference oscillator for outputting a reference signal having a frequency equal to a predetermined frequency step, a phase comparator for detecting the phase or frequency difference between an output signal from the variable frequency divider and the reference signal, and outputting the detected phase or frequency difference to the low-pass filter. The second PLL has a VCO controllable by a low-pass filter for outputting a signal, a mixer for frequency-converting the signal from the VCO with the signal from the VCO of the first PLL to output a playback clock signal, and a phase comparator for detecting the phase difference between a reproduced data signal and the playback clock signal and outputting the detected phase difference to the low-pass filter.

14 Claims, 7 Drawing Sheets

PLAYBACK CLOCK SIGNAL GENERATING CIRCUIT WHICH USES A FIRST AND SECOND PHASE LOCK LOOP

BACKGROUND OF THE INVENTION

1. Field of the Invention

The present invention relates to a method of and a circuit for generating a playback clock signal for use in a disk recording and reproducing apparatus for recording data on and reproducing data from a disk such as a magnetic disk, an optical disk, or a magnetooptical disk, and more particularly to a method of and a circuit for generating a playback clock signal for use in a disk recording and reproducing apparatus which records data on a disk with a constant wavelength (CWL) or density while the disk is being rotated at a constant angular velocity (CAV).

2. Description of the Related Art

There have been known various data recording processes for use in disk recording and reproducing apparatus which records data on and reproduces data from a disk such as a magnetic disk, an optical disk, or a magnetooptical disk. The known data recording processes include a constant angular velocity (CAV) process for recording data on a disk at a constant angular velocity, a constant linear velocity (CLV) process for recording data on a disk at a constant linear velocity, and a CWL-CAV process for recording data on a disk with a constant wavelength while the disk is being rotated at a constant angular velocity.

The CAV process allows easy high-speed search and rotation control. However, since the linear velocity of tracks becomes higher progressively toward the outer circumferential edge of the disk, the recording density achieved by the CAV process is relatively low, making the CAV process unsuitable for high-density recording. The CLV process can record data at a high density on the disk because the recording density of all tracks is constant. However, it is difficult with the CLV process to control the disk to rotate instantaneously at a desired speed when a certain track is sought upon playback.

The CWL-CAV process which is disclosed in Japanese Patent Laid-Open No. 175968/1986 has been proposed in order to eliminate the above difficulties. According to the disclosed CWL-CAV process, while the rotational speed of a disk is being kept constant, the recording clock frequency is made higher toward the outer circumferential edge of the disk for recording data on the disk at a constant recording density, thereby permitting high-speed search and high-density recording on the disk.

CWL-CAV disk recording and reproducing apparatus generally operates to detect the position of a recording head, i.e., the distance from the center of the disk to the recording head, and vary the clock frequency depending on the detected position of the recording head for recording data on the disk. The position of the recording head may be detected by either mechanically reading the recording head position or previously recording the track addresses of respective tracks and reading the track addresses. The recording density can be rendered uniform when the clock frequency is linearly varied depending on the recording head position. Practically, however, the clock frequency is varied stepwise in certain frequency steps each corresponding to a plurality of tracks. Blocks of tracks grouped by the clock frequencies are referred to as clock blocks.

For demodulating reproduced data with CWL-CAV disk recording and reproducing apparatus, it is necessary to generate a playback clock signal which is held in synchronism with the reproduced data. One conventional playback clock signal generating circuit is shown in FIG. 1 of the accompanying drawings.

Figure 1:
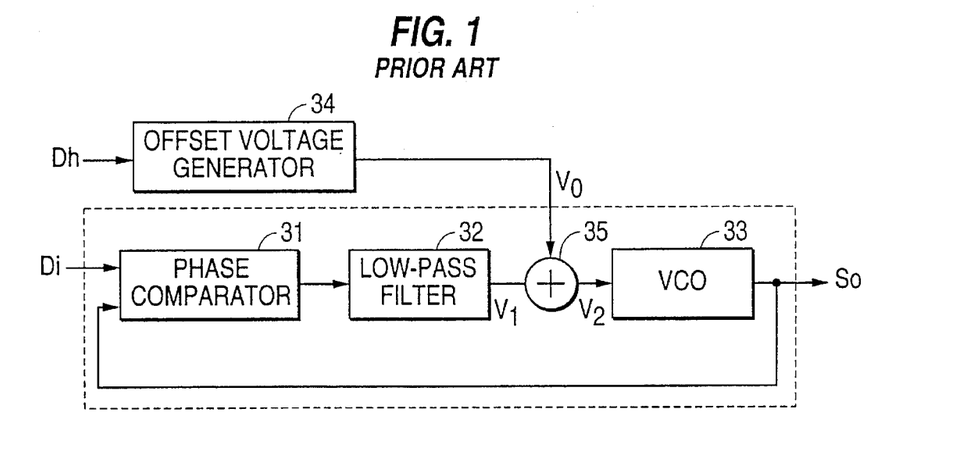
FIG. 1 is a block diagram of a conventional playback clock signal generating circuit.

As shown in FIG. 1, the playback clock signal generating circuit is supplied with head position information Dh and reproduced data Di and generates a playback clock signal So in synchronism with the reproduced data Di.

The head position information Dh is information indicative of the distance from the center of the disk to the recording head. The playback clock signal generating circuit has a phase comparator 31, a low-pass filter 32, and a voltage-controlled oscillator (VCO) 33 which jointly serve as a known phase-locked loop (PLL). The playback clock signal generating circuit also has an offset voltage generator 34 and an adder 35 for bringing the playback clock signal So into synchronism with the reproduced data Di in a short period of time.

The offset voltage generator 34 generates an offset voltage Vo in response to the head position information Dh. The adder 35 adds the offset voltage Vo to a control voltage V1 outputted from the low-pass filter 32, and supplies the sum as a control voltage V2 to the voltage-controlled oscillator 33. Responsive to the control voltage V2, the voltage-controlled oscillator 33 oscillates, outputting the playback clock signal So.

In the conventional playback clock signal generating circuit, the control voltage produced by the voltage-controlled oscillator 33 is shifted depending on the head position for varying the center frequency of the phase-locked loop, whereby the playback clock signal So can quickly be synchronized for a change in the clock frequency. However, the voltage-controlled oscillator 33 has its characteristics susceptible to temperature-dependent changes and aging, which are difficult to eliminate. Consequently, even if the voltage-controlled oscillator has initially been adjusted for optimum characteristics, its characteristics vary in use, resulting in a prolonged period of time required to synchronize the playback clock signal So with the reproduced data Di and a higher possibility that the playback clock signal So may be shifted out of synchronism with the reproduced data Di.

SUMMARY OF THE INVENTION

It is therefore an object of the present invention to provide a method of and a circuit for generating a playback clock signal for use in a disk recording and reproducing apparatus for recording data on and reproducing data from a disk such as a magnetic disk, an optical disk, or a magnetooptical disk, stably against temperature-dependent changes and aging to synchronize the playback clock signal with reproduced data in a short period of time.

According to the present invention, the above object can be achieved by a playback clock signal generating circuit having a first phase-locked loop for outputting a first signal having a frequency variable in a predetermined frequency step depending on the head position information, and a second phase-locked loop for outputting a playback clock signal in response to the reproduced data signal and the first signal.

Since the operating frequency of a voltage-controlled oscillator of the second phase-locked loop is kept substantially constant by the first signal outputted from the first phase-locked loop, the playback clock signal generating circuit operates stably against temperature-dependent changes or aging. The playback clock signal generating circuit can synchronize the playback clock signal quickly and reliably with the reproduced data signal when the frequency of the reproduced data signal varies to a large extent.

The first phase-locked loop may comprise a first voltage-controlled oscillator for outputting the first signal, a variable frequency divider for varying a frequency-dividing number depending on the head position information and frequency-dividing the first signal with the varied frequency-dividing number, a reference oscillator for outputting a reference signal having a frequency equal to the predetermined frequency step, a first phase comparator responsive to an output signal from the variable frequency divider and the reference signal, for detecting the phase or frequency difference therebetween, and a first low-pass filter connected between the first phase comparator and the first voltage-controlled oscillator. The second phase-locked loop may comprise a second voltage-controlled oscillator for outputting a second signal, a mixer for frequency-converting the second signal with the first signal to output the playback clock signal, a second phase comparator responsive to the reproduced data signal and the playback clock signal outputted from the mixer, and a second low-pass filter connected between the second phase comparator and the second voltage-controlled oscillator.

The first phase-locked loop may alternatively have frequency-converting means for shifting the frequency of the first signal by a predetermined frequency, a variable frequency divider for varying a frequency-dividing number depending on the head position information and frequency-dividing an output signal from the frequency-converting means with the varied frequency-dividing number, a first phase comparator responsive to an output signal from the variable frequency divider and the reference signal, for detecting the phase difference therebetween, and a first low-pass filter connected between the first phase comparator and the first voltage-controlled oscillator.

The second phase-locked loop may have a range of synchronizing frequencies which is established depending on an error of the head position information.

Inasmuch as the playback clock signal generating circuit operates normally without bringing the playback clock signal out of synchronism with the reproduced data signal due to a head position detecting error, the playback clock signal generating circuit may have its cost reduced by employing a less accurate head position detecting system.

The second phase-locked loop may have pulse generating means for generating pulses at a frequency which is the same as an output signal from the second phase comparator, the pulses each having a duration in a predetermined proportion with respect to the period of the playback clock signal, the second low-pass filter comprising means for filtering a signal representative of the difference between the output signal from the second phase comparator and an output signal from the pulse generating means.

With such an arrangement, a phase variation owing to a deviation in the frequency distribution of inverted intervals of the reproduced data.

A change in the frequency of the second voltage-controlled oscillator is detected, and the frequency-dividing number obtained from the head position information is varied depending on the detected change. Thus, when the range of synchronizing frequencies of the second phase-locked loop is set depending on a head position detecting error, it is possible to absorb a phase offset between the reproduced data signal and the playback clock signal. Consequently, the reproduced data can be decoded properly even when there is a head position detecting error.

The above and other objects, features, and advantages of the present invention will become apparent from the following description referring to the accompanying drawings which illustrate preferred embodiments of the present invention by way of example.

DETAILED DESCRIPTION OF THE PREFERRED EMBODIMENTS

Figure 2:
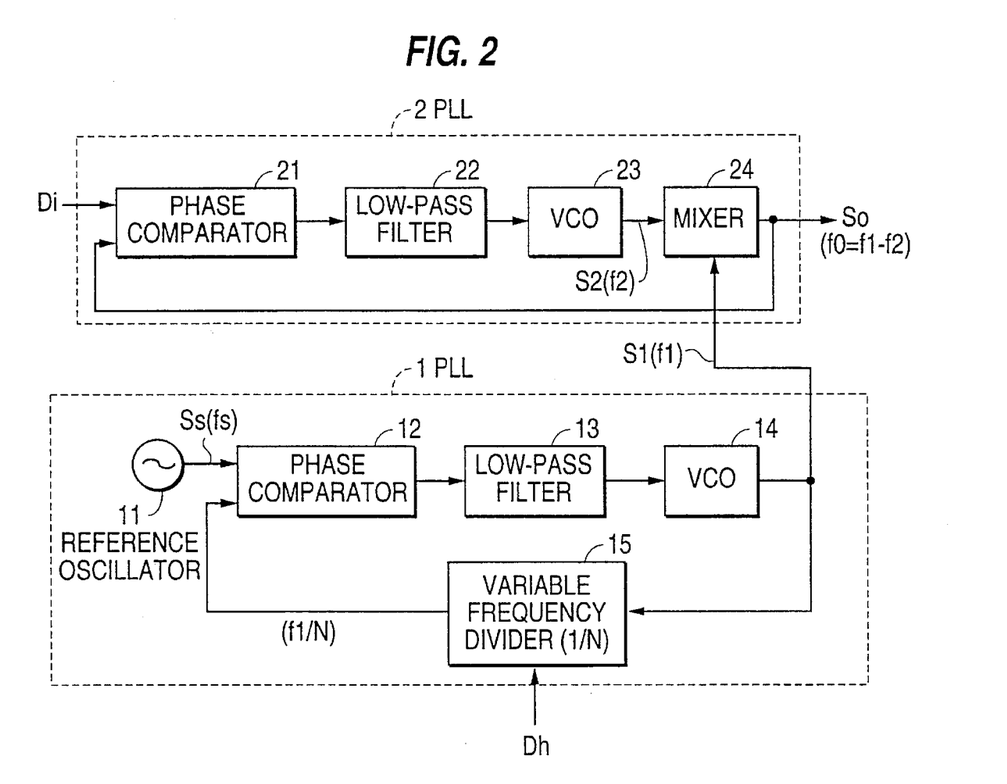
FIG. 2 is a block diagram of a playback clock signal generating circuit according to a first embodiment of the present invention.

As shown in FIG. 2, a playback clock signal generating circuit according to a first embodiment of the present invention comprises a first phase-locked loop PLL 1 responsive to head position information Dh for outputting a signal S1 having a frequency f1 depending on the position of a magnetic head as it moves radially across a disk, and a second phase-locked loop PLL 2 for outputting a playback clock signal So in response to reproduced data Di and the output signal S1 from the first phase-locked loop 1.

The first phase-locked loop 1 comprises a reference oscillator 11 for outputting a reference signal Ss having a reference frequency fs, a phase comparator 12, a low-pass filter 13, a voltage-controlled oscillator VCO 14 for outputting a signal S1 having a frequency f1, and a variable frequency divider 15 for dividing the frequency f1 of the signal S1 with a variable frequency-dividing ratio 1/N depending on head position information Dh and outputting a frequency-divided signal to the phase comparator 12. The second phase-locked loop 2 comprises a phase comparator 21 for comparing the phase of reproduced data Di and the phase of a playback clock signal So, a low-pass filter 22, a voltage-controlled oscillator VCO 23 for outputting a signal S2 having a frequency f2, and a mixer 24 for outputting a playback clock signal So having a frequency fo in response to the signal S2 and the signal S1 from the first phase-locked loop 1.

If the first phase-locked loop 1 is in a phase-locked state, then the following equation (1) is satisfied:

$$f1/N=fs \quad (1)$$

where N is the frequency-dividing number, which is 1 or a greater integer, of the variable frequency divider 15. If the reference frequency fs of the reference signal Ss is equal to a predetermined frequency step δ corresponding to a clock block, i.e., if fs=δ, then the frequency f1 of the signal S1 can be varied by the frequency step δ depending on the frequency-dividing number N.

It is assumed that the following equation (2) is satisfied with respect to the output signal from the mixer 24:

$$f1-f2=fo \quad (2)$$

f1>f2.

When the equation (1) is substituted in the equation (2) and fs=δ, the following equation (3) results:

$$N*fs-f2=N*\delta-f2=fo \quad (3)$$

Therefore, by setting the frequency f2 of the output signal from the voltage-controlled oscillator 23 to a suitable value and varying the frequency-dividing number N depending on the head position information Dh, it is possible to synchronize the frequency fo of the playback clock signal So with the reproduced data Di whose frequency varies depending on the head position. Since the oscillation frequency f2 of the voltage-controlled oscillator 23 is substantially constant and can easily catch up with phase variations of the reproduced data Di, the playback clock signal So can quickly be brought into synchronism with the reproduced data Di even when the frequency of the reproduced data Di varies to a large extent.

In order to synchronize the playback clock signal So reliably with the reproduced data Di even when a head position detecting system suffers an error, the range of synchronizing frequencies of the second phase-locked loop 2 may be selected depending on the head position detecting error. More specifically, if the head position detecting error is less than ±n (n is 1 or a greater integer) as converted in terms of clock blocks, then the range of synchronizing frequencies is set to at least ±n*δ with respect to the center frequency. With the range of synchronizing frequencies being thus set, the playback clock signal So is not brought out of synchronism with the reproduced data Di even when there is a head position detecting error, so that the playback clock signal generating circuit can operate normally. For example, if one clock block has an interval of 0.24 mm in the radial direction of the disk, then when a head position detecting error is ±0.3 mm, since the head position detecting error is ±1.25, i.e., less than ±2, in terms of clock blocks, the range of synchronizing frequencies is set to ±2δ with respect to the center frequency. With such a frequency range setting, since the playback clock signal So is kept in synchronism with the reproduced data Di even if the head position detecting system has a reduced degree of accuracy, the cost of the playback clock signal generating circuit may be lowered.

If it is assumed that the phase difference between the signals applied to the phase comparator 21 is in the range of from −φ to +φ (rad.), the output voltage from the low-pass filter 22 is proportional to the phase difference in that range, a delay time caused in the phase-locked loop is τ (sec.), and the range of synchronizing frequencies of the phase-locked loop is Fc (Hz), then the following relationship is generally satisfied:

$$Fc \leq \phi/(\pi*\tau) \quad (4).$$

Inasmuch as the maximum value of the range of synchronizing frequencies is $\phi/(\pi*\tau)$, the range of synchronizing frequencies can be increased by increasing φ and reducing τ.

Figure 3:
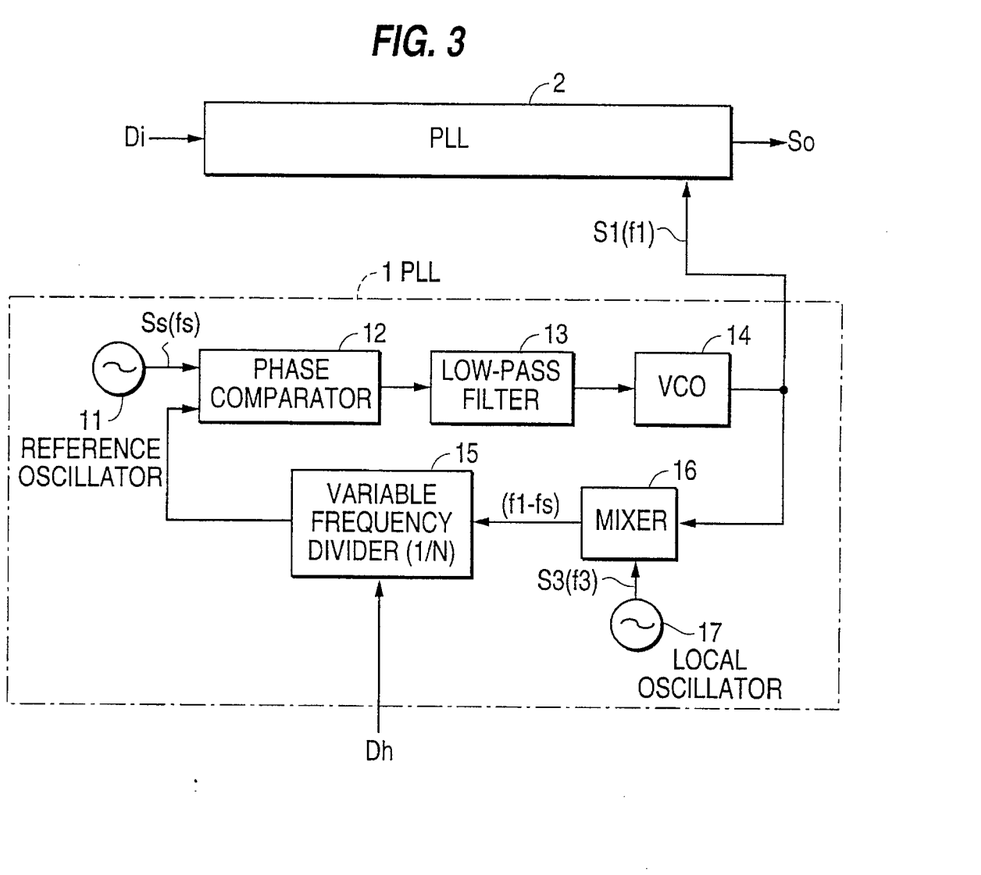
FIG. 3 is a block diagram of another phase-lock loop which may be employed in the playback clock signal generating circuit shown in FIG. 2.

FIG. 3 shows in block form another first phase-locked loop which may be employed in the playback clock signal generating circuit shown in FIG. 2. The first phase-locked loop PLL shown in FIG. 3 differs from the first phase-locked loop PLL 1 shown in FIG. 2 in that a mixer 16 and a local oscillator 17 are added. The other structural details of the first phase-locked loop shown in FIG. 3 are identical to those shown in FIG. 2, and denoted by identical reference numerals.

If it is assumed that the local oscillator 17 produces an output signal S3 having a frequency f3, the mixer 16 has an output frequency f1−f3 (f1>f3), and the frequency-dividing number N of the variable frequency divider 15 is 1 or a greater integer, then insofar as the phase-locked loop is in a phase-locked state, the following equation (5) is satisfied:

$$N*fs+f3=f1 \quad (5).$$

When the equation (5) is substituted in the equation (2) and fs=δ, the following equation (6) results:

$$N*\delta+f3-f2=fo \quad (6).$$

Therefore, by adding the mixer 16 and the local oscillator 17 to the first phase-locked loop 1 and setting the frequency f3 of the local oscillator 17 to a suitable value, the output frequency fo can be shifted as desired.

Figure 4:
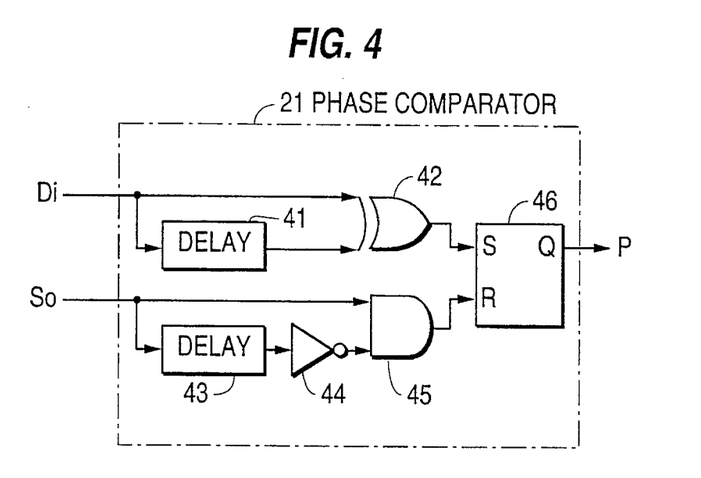
FIG. 4 is a block diagram of a phase comparator.

The phase comparator 21 of the second phase-locked loop for extracting a clock signal from digital data may be of an arrangement shown in FIG. 4. In the phase comparator 21 shown in FIG. 4, a delay circuit 41 and an exclusive-OR gate 42 jointly generate pulses in timed relation to positive- and negative-going edges of the reproduced data Di, and the generated pulses are applied to an S input terminal of an R-S flip-flop 46. A delay circuit 43, an inverter 44, and an AND gate 45 jointly generate pulses in timed relation to positive-going edges of the playback clock signal So, and the generated pulses are applied to an R input terminal of the R-S flip-flop 46. Therefore, the phase comparator 21 outputs a pulse P having a pulse duration depending on the phase difference each time an edge of the supplied reproduced data Di appears. The pulse duration increases when the playback clock signal So lags behind the reproduced data Di, and decreases when the playback clock signal So leads the reproduced data Di.

Figure 6A:
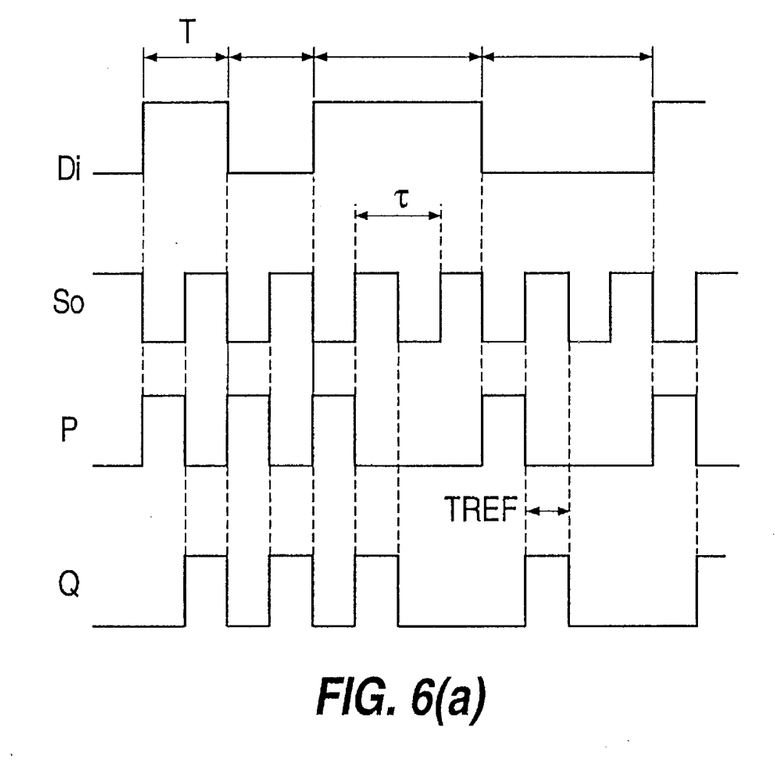
FIG. 6 is a timing chart of signals in the circuit arrangements shown in FIGS. 4 and 5.
Figure 6B:
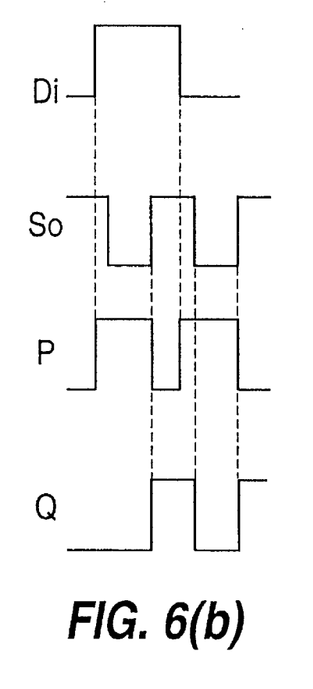
Figure 6C:
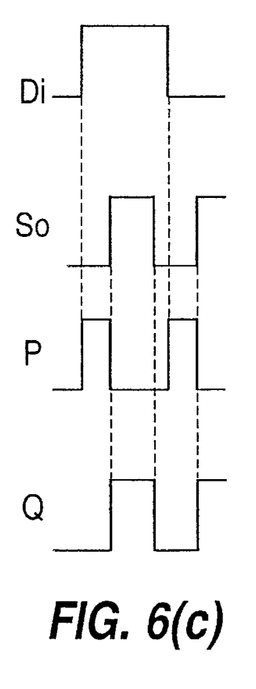
Figure 7A:
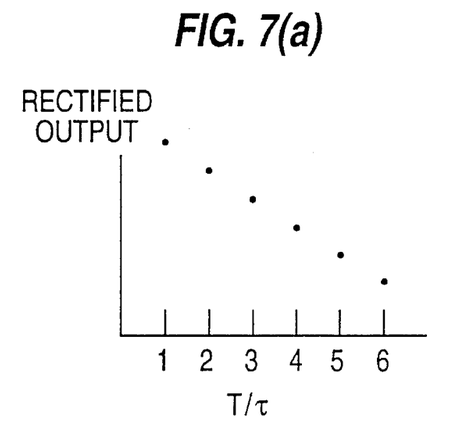
FIGS. 7(a) and 7(b) are diagrams showing the relationship between rectified output values of the phase comparator and inverted intervals T of reproduced data Di, as normalized by the period $\tau$ of a playback clock signal So.

FIG. 6 is a timing chart of the reproduced data Di, the playback clock signal So, and the output signal P of the phase comparator 21. As shown in FIG. 6 at (a), as the inverted interval T of the reproduced data Di increases, the rectified value of the output signal P from the phase comparator 21 decreases. Such a condition is illustrated in FIG. 7(a). Actually, reproduced data having different inverted intervals are supplied, and the rectified values of output signals from the phase comparator 21 are averaged. However, if there is a time-dependent deviation in the frequency distribution of inverted intervals, then the rectified value varies.

As described above, since the frequency of the playback clock signal So is varied by a first phase block, the oscillation frequency of the voltage-controlled oscillator VCO 23 becomes substantially constant, i.e., the input voltage of the voltage-controlled oscillator 23 becomes substantially constant. If there is a time-dependent deviation in the frequency distribution of inverted intervals T of the reproduced data Di, then the rectified value of the output signal P from the phase comparator 21, i.e., the input voltage of the voltage-controlled oscillator 23, varies. Because the input voltage of the voltage-controlled oscillator 23 has to be constant upon synchronization, the phase of the playback clock signal So is shifted in order to compensate for a change due to the deviation in the frequency distribution of inverted intervals T. Therefore, when the frequency distribution of inverted intervals T suffers a time-dependent deviation, the jitter of the playback clock signal So increases, inducing erroneous data decoding.

Figure 5:
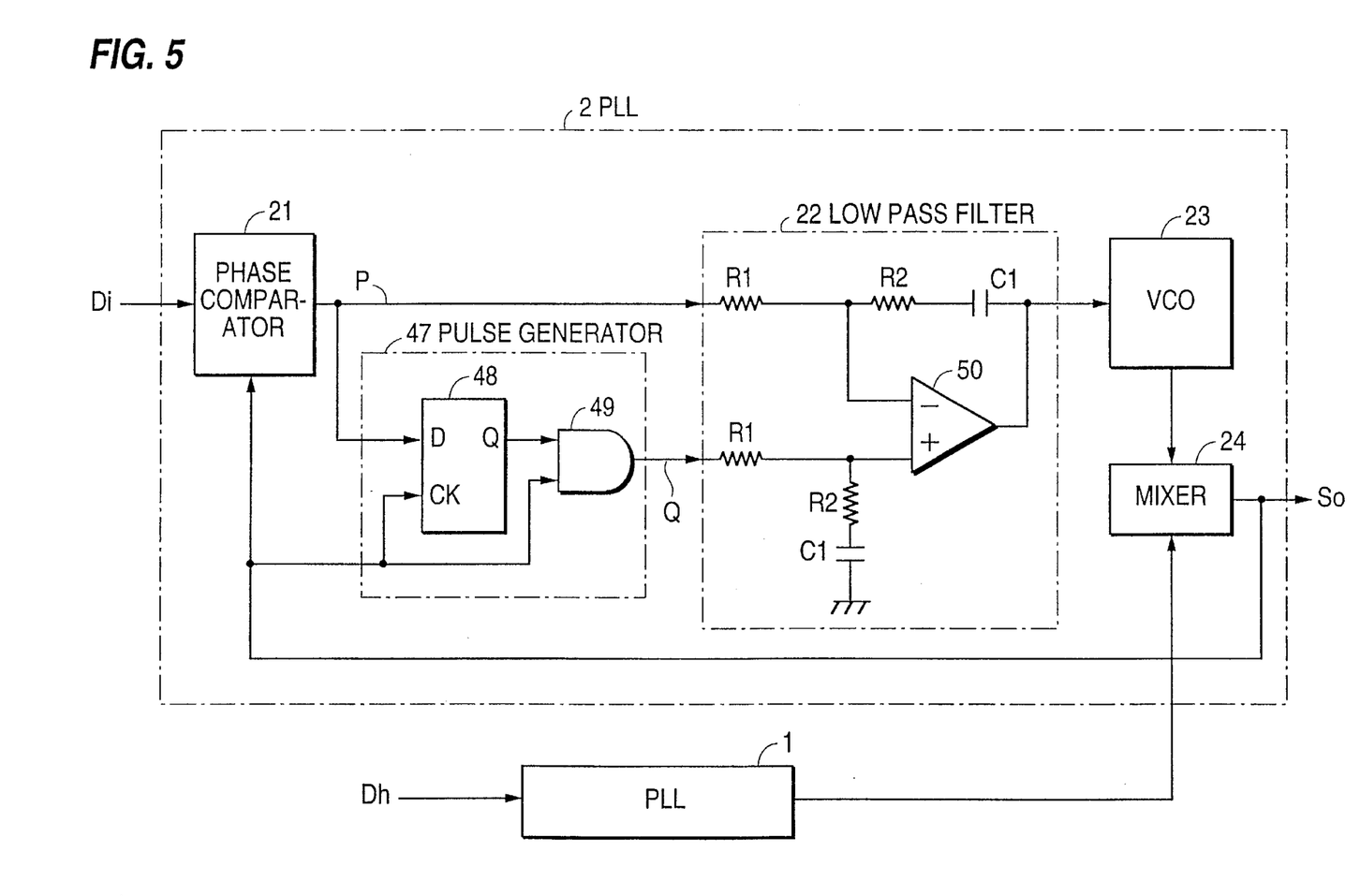
FIG. 5 is a block diagram of a playback clock signal generating circuit according to a second embodiment of the present invention.

FIG. 5 shows in block form a playback clock signal generating circuit according to a second embodiment of the present invention. The playback clock signal generating circuit according to the second embodiment is designed to prevent a phase shift even when there is a time-dependent deviation in the frequency distribution of inverted intervals T of the reproduced data Di.

In FIG. 5, the playback clock signal generating circuit has a second phase-locked loop PLL 2 which comprises a phase comparator 21, a pulse generator 47, a low-pass filter 22, a voltage-controlled oscillator VCO 23, and a mixer 24. The phase comparator 21 may be of the circuit arrangement shown in FIG. 4, for example. The pulse generator 47 comprises a D flip-flop 48 and an AND gate 49. With a playback clock signal So used as a clock signal, the D flip-flop 48 produces a signal produced by latching an output signal P from the phase comparator 21. The signal thus produced by the D flip-flop 48 and the playback clock signal So are ANDed by the AND gate 49, which generates a pulse Q. The pulses Q thus produced by the pulse generator 47 have the same frequency as the output signal P from the phase comparator 21. The low-pass filter 22 filters the signal representing the difference between the output signal P from the phase comparator 21 and the output signal Q from the pulse generator 47, and outputs the filtered signal to the voltage-controlled oscillator 23. The playback clock signal generating circuit also has a first phase-locked loop 1 which produces an oscillating signal having a predetermined frequency in response to head position information Dh. The oscillating signal from the first phase-locked loop 1 is applied to the mixer 24, which frequency-converts the output signal from the voltage-controlled oscillator 23, thereby producing the playback clock signal So.

FIG. 6 shows various signals in the playback clock signal generating circuit shown in FIG. 5. Each of the output signal P from the phase comparator 21 and the output signal Q from the pulse generator 47 contains a pulse that is generated each time an edge of the reproduced data Di appears. The output signal Q from the pulse generator 47 has a pulse duration Tref having a predetermined proportion with respect to the period τ of the playback clock signal So. In this embodiment, the pulse duration Tref of the output signal Q from the pulse generator 47 is equal to τ/2. The pulse duration of the output signal P from the phase comparator 21 varies depending on the phase difference, and has a maximum value up to the period τ of the playback clock signal So.

Figure 7B:
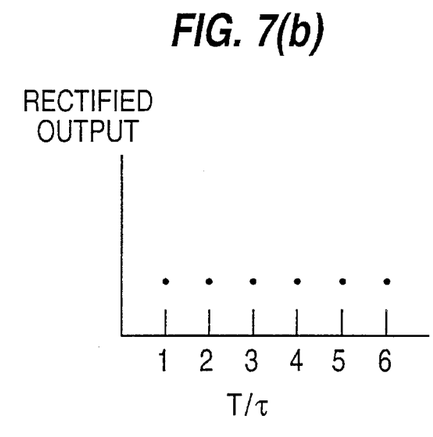

When the pulse duration of the output signal P from the phase comparator 21 and the pulse duration of the output signal Q from the pulse generator 47 are equal to each other, the rectified value of the difference between the signals P, Q is constant irrespective of the inverted interval T of the reproduced data Di. Such a condition is shown in FIG. 7(b). In this case, the phase relationship between the reproduced data Di and the playback clock signal So is not varied by variations in the frequency distribution of inverted intervals T of the reproduced data Di.

By thus setting the range of synchronizing frequencies of the second phase-locked loop to ±n*δ with respect to the center frequency, the playback clock signal So is held in synchronism with the reproduced data Di insofar as the head position detecting error remains within ±n as converted in terms of clock blocks. When a head position detecting error occurs within ±n, a phase offset is produced between the reproduced data Di and the playback clock signal So from the phase difference which would be caused when the head position detection is correct. When reproduced data are to be decoded using the reproduced data Di and the playback clock signal So, a phase offset between the reproduced data Di and the playback clock signal So may tend to cause a change in the data detection phase, resulting in a poor error rate. If the sign + of the head position error n indicates an error in a direction to increase the frequency of the signal S1 and the sign − of the head position error n indicates an error in a direction to reduce the frequency of the signal S1, the operation of the playback clock signal generating circuit at the time when the head position detecting error is −n is indicated by the following equation (7) or (8):

$$fo = f1 - f2 \quad (7)$$
$$= (N-n)*fs - (f2 - n*fs)$$
$$= (N-n)*\delta - (f2 - n - \delta)$$
$$= (N*\delta - n*\delta) - (f2 - n*\delta)$$
$$= N*\delta - f2. \quad (8)$$

The first and second terms of the equation (7) represent respective operations of the first and second phase-locked loops. "−n*δ" in the first term represents a frequency difference of the signal S1 which is caused by the head position detecting error −n. "−n*δ" in the second term indicates the absorption by the second phase-locked loop of the frequency difference −n*δ which is caused in the output signal S1 of the first phase-locked loop by the head position error −n.

Since the range of synchronizing frequencies of the second phase-locked loop 2 is ±n*δ with respect to the center frequency, the equation (8) is equal to the equation (3). This indicates that the frequency of the output signal So does not vary. However, the output signal S2 from the voltage-controlled oscillator of the second phase-locked loop suffers a frequency shift −n*δ with respect to the frequency f2 at the time the head position information Dh is correct, and such a frequency shift generates a phase shift between the reproduced data Di and the playback clock signal So. When the reproduced data are decoded, the phase offset results in a detected phase shift, tending to decode the reproduced data improperly.

Figure 8:
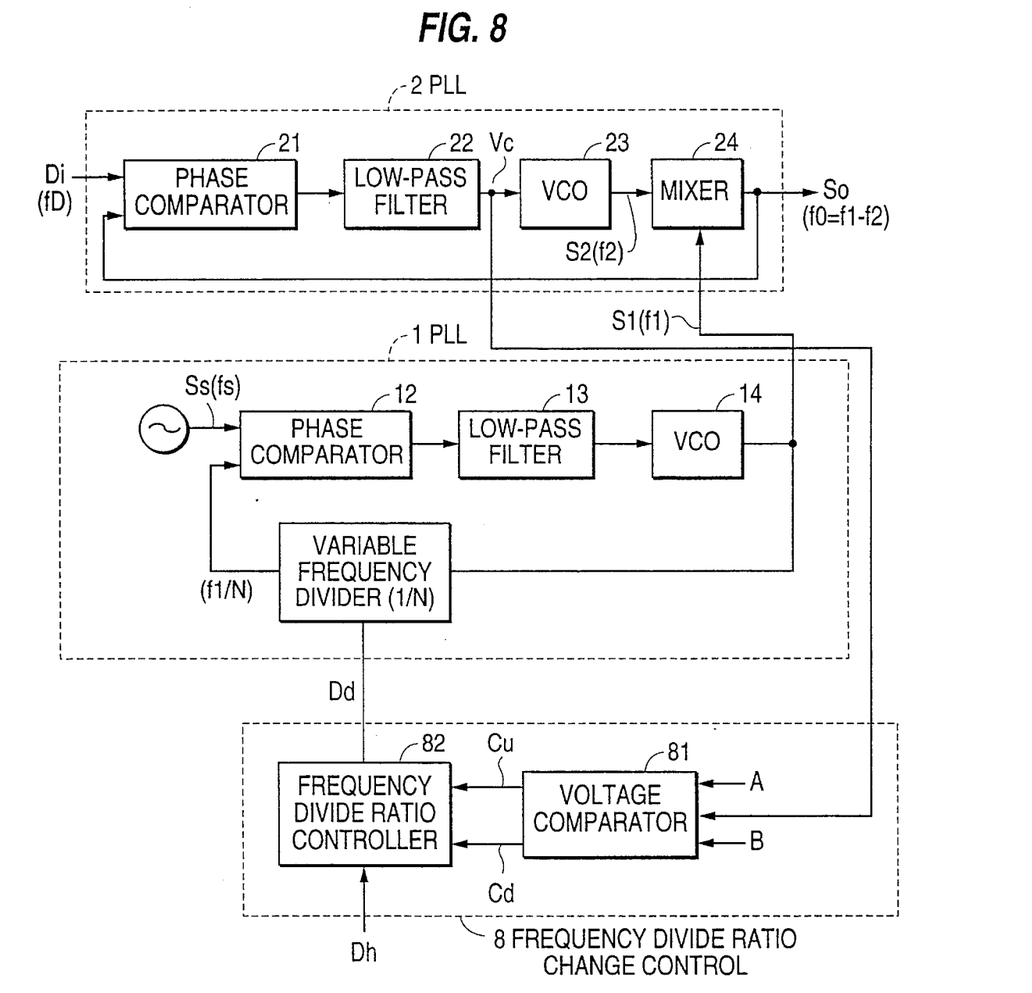
FIG. 8 is a block diagram of a playback clock signal generating circuit according to a third embodiment of the present invention.

FIG. 8 shows in block form a playback clock signal generating circuit accordingto a third embodiment of the present invention. The playback clock signal generating circuit shown in FIG. 8 comprises a first phase-locked loop PLL 1 responsive to frequency-dividing-ratio changing data Dd for outputting a signal S1 having a frequency f1 depending on the frequency-dividing-ratio changing data Dd, a second phase-locked loop PLL 2 responsive to reproduced data Di and the output signal S1 from the first phase-locked loop PLL 1 for outputting a playback clock signal So, and a frequency-dividing-ratio changer 8 responsive to head position information Dh for outputting frequency-dividing-ratio changing data Dd depending on a frequency shift, as detected by the second phase-locked loop PLL 2, of the output signal S1 from the first phase-locked loop PLL 1. The first phase-locked loop 1 and the second phase-locked loop 2 are the same as those of the first embodiment shown in FIG. 2.

The frequency-dividing-ratio changer 8 comprises a voltage comparator 81 for comparing a control voltage Vc from the voltage-controlled oscillator VCO 23 of the second phase-locked loop PLL 2 with reference voltages VrefA, VrefB with each other, and outputting signals Cu, Cd indicative of the results of comparison, and a frequency-dividing-ratio controller 82 for outputting a frequency-dividing-ratio changing signal Dd to the first phase-locked loop 1 depending on the signals Cu, Cd.

Operation of the playback clock signal generating circuit at the time head position information Dh contains no detecting error.

If a correct frequency-dividing ratio N depending on the head position information Dh is supplied to the first phase-locked loop 1 by the frequency-dividing-ratio changing signal Dd and the reference frequency fs of the reference signal Ss is equal to a predetermined frequency step δ, then the above equations (1) through (3) are satisfied.

Therefore, the playback clock signal So is synchronized with the reproduced data Di.

The range of synchronizing frequencies of the second phase-locked loop 2 is ±n*δ with respect to the center frequency. Even when the head position detecting error becomes −n as converted in terms of clock blocks, the equation (7) is satisfied.

Figure 10:
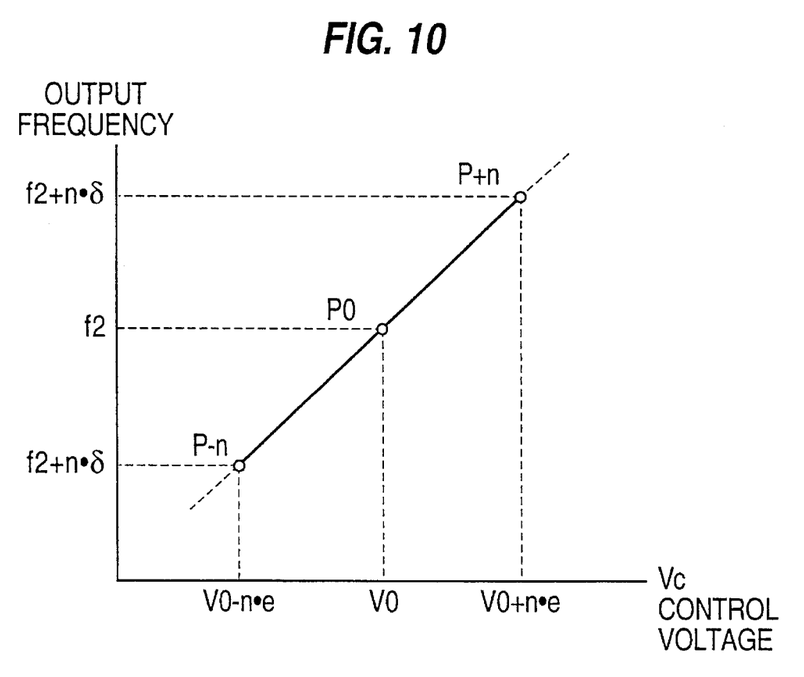
FIG. 10 is a diagram showing the relationship between output signal frequencies and control voltages, illustrative of operation of a second voltage-controlled oscillator in the playback clock signal generating circuit shown in FIG. 8.

FIG. 10 shows control voltages plotted against output signal frequencies of the voltage-controlled oscillator 23. The output signal frequency of the voltage-controlled oscillator 23 varies substantially linearly with the control voltage in a range of f2±nδ which is equal to the range of synchronizing frequencies of the second phase-locked loop 2. In FIG. 10, V0 represents a control voltage when the head position information Dh contains no detecting error with the correct frequency-dividing ratio N, f2 represents the output frequency of the voltage-controlled oscillator 23 at that time, and P0 represents such a condition. If the head position information Dh contains an error n, as converted in terms of clock blocks, in a direction to lower the frequency fo of the playback clock signal So, then when the control voltage has a value V0−n*e, the output frequency has a value f2−n*δ, and such a condition is indicated by P−n in FIG. 10. If the head position information Dh contains an error n, as converted in terms of clock blocks, in a direction to increase the frequency fo of the playback clock signal So, then when the control voltage has a value V0+n*e, the output frequency has a value f2+n*δ, and such a condition is indicated by P+n in FIG. 10.

It can be seen from FIG. 10 that if the head position information Dh contains an error n, as converted in terms of clock blocks, tending to vary the frequency fo of the playback clock signal So, then the control voltage Vc varies a value n*e from the value V0. Therefore, by detecting the change in the control voltage Vc of the voltage-controlled oscillator 23, it is possible to determine how much the output frequency f2 of the voltage-controlled oscillator 23 is shifted from the center frequency of the clock frequency fD of the reproduced data Di, i.e., whether the first phase-locked loop 1 operates with a correct frequency-dividing ratio with respect to the clock frequency fD of the reproduced data Di.

In the frequency-dividing-ratio changer 8, the voltage comparator 81 compares the control voltage Vc of the voltage-controlled oscillator 23 with the two reference voltages A=V0+α, B=V0−α. If the control voltage Vc is higher than the reference voltage A, then the signal Cd, i.e., a frequency-dividing-ratio reducing flag, is rendered effective, and if the control voltage Vc is lower than the reference voltage B, then the signal Cu, i.e., a frequency-dividing-ratio increasing flag, is rendered effective. It is preferable to set the constant α to α=e/2 in order for the voltage comparator 81 to be able to detect a detecting error of the head position information Dh even when the detecting error is ±1 as converted in terms of clock blocks.

When the head position information Dh is −n, if the correct frequency with respect to the clock frequency fD of the reproduced data Di is f1, then the frequency of the output signal Si from the first phase-locked loop 1 is f1−n*δ. The second phase-locked loop 2 absorbs the produced frequency f1−n*δ, with the result that the frequency of the output signal S2 from the voltage-controlled oscillator 23 varies −n*δ. Such a condition is represented by the point P−n in FIG. 10. Inasmuch as the control voltage Vc at the point P−n is V0−n*δ and V<V0−α in the voltage comparator 81, the voltage comparator 81 outputs the signal Cu as effective. In response to the frequency-dividing-ratio increasing flag Cu, the frequency-dividing-ratio controller 82 determines that the head position information Dh has an error in a direction to lower the playback clock signal So, and controls the frequency-dividing-ratio changing signal Dd determined depending on the head position information Dh so as to increment the frequency-dividing ratio by 1. If the head position detecting error is −1, then when the frequency-dividing ratio is incremented by 1, the operating condition shifts from the point P−n to the point P0 in FIG. 10, resulting in a correct frequency-dividing ratio with respect to the reproduced data Di. If the head position detecting error is 1 or other value, a correct frequency-dividing ratio can be achieved by repeating the frequency-dividing-ratio control process n times.

Figure 9:
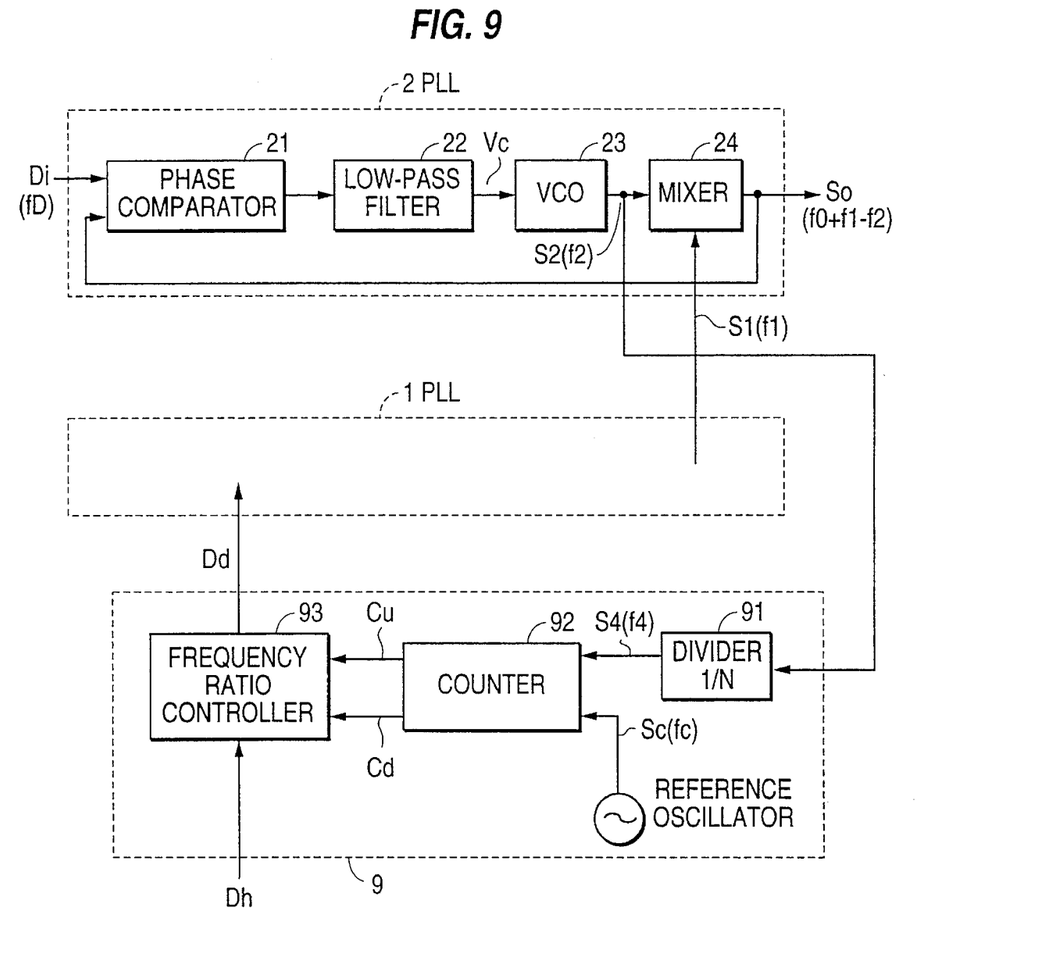
FIG. 9 is a block diagram of another frequency-dividing-ratio changer which may be employed in the playback clock signal generating circuit shown in FIG. 8.

FIG. 9 shows in block form another frequency-dividing-ratio changer.

The frequency-dividing-ratio changer 8 shown in FIG. 8 detects a head position error based on the control voltage Vc of the voltage-controlled oscillator VCO 23. In FIG. 9, a frequency-dividing-ratio changer 9 detects a head position error based on the frequency f2 of the output signal S2 from the voltage-controlled oscillator VCO 23.

The frequency-dividing-ratio changer 9 shown in FIG. 9 comprises a frequency divider 91 for frequency-dividing the output signal S2 from the voltage-controlled oscillator VCO 23 and outputting a frequency-divided signal S4 having a frequency f4, a reference oscillator 94 for outputting a reference signal Sc having a reference frequency fc, a counter 92 for counting the periods of the frequency-divided signal S4 with the reference signal Sc and outputting a frequency-dividing-ratio increasing flag Cu and a frequency-dividing-ratio reducing flag Cd, and a frequency-dividing-ratio controller 93 for outputting frequency-dividing-ratio changing data Dd depending on head position information Dh, the frequency-dividing-ratio increasing flag Cu, and the frequency-dividing-ratio reducing flag Cd.

The frequency-dividing-ratio controller 93 detects the operating condition of the voltage-controlled oscillator 23 based on the output frequency thereof. The frequency divider 91 frequency-divides the output signal S2 from the voltage-controlled oscillator 23, and the counter 92 measures the period 1/f4 of the signal S4 with the reference signal S4 outputted from the reference oscillator 94. In the absence of any frequency-dividing-ratio shift, when the period of the signal S4 is shorter than 1/f4=1/(f2*M), the frequency of the signal S2 is f2+n*δ, and the operating condition is at the point P+n, so that the signal Cu is rendered effective. When the period of the signal S4 is longer than 1/f4=1/(f2*M), the frequency of the signal S2 is f2−n*δ, and the operating condition is at the point P−n, so that the signal Cd is rendered effective.

Subsequently, correct frequency-dividing-ratio changing data Dd with respect to the reproduced data Di are produced by effecting the above frequency-dividing-ratio changing process.

It is to be understood that variations and modifications of the specific embodiments disclosed herein will be evident to those skilled in the art. It is intended that all such modifications and variations be included within the scope of the appended claims.

What is claimed is:

1. A playback clock signal generating circuit of a disk recording and reproducing apparatus for generating a playback clock signal in accordance with a head position information and reproduced data signal, comprising: a first phase-locked loop for outputting a first signal having a variable frequency in a predetermined frequency step depending on the head position information, wherein said first phase-locked loop includes a first voltage-controlled oscillator for outputting said first signal, a variable frequency divider for varying a frequency-dividing number depending on said head position information and frequency-dividing said first signal with the varied frequency-dividing number, a reference oscillator for outputting a reference signal having a frequency equal to said predetermined frequency step, a first phase comparator responsive to an output signal from said variable frequency divider and said reference signal, for detecting the phase difference therebetween, and a first low-pass filter connected between said first phase comparator and said first voltage-controlled oscillator; and a second phase-locked loop for outputting a playback clock signal in response to the reproduced data signal and said first signal wherein said second phase-locked loop includes a second voltage-controlled oscillator for outputting a second signal, a mixer for frequency-converting said second signal with said first signal to output said playback clock signal, a second phase comparator responsive to the reproduced data signal and the playback clock signal outputted from said mixer, and a second low-pass filter connected between said second phase comparator and said second voltage-controlled oscillator.

2. A playback clock signal generating circuit according to claim 1, wherein said second phase-locked loop further includes pulse generating means for generating pulses at a frequency which is the same as an output signal from said second phase comparator, said pulses each having a duration in a predetermined proportion with respect to the period of the playback clock signal, said second low-pass filter comprising means for filtering a signal representative of the difference between the output signal from said second phase comparator and an output signal from said pulse generating means.

3. A playback clock signal generating circuit according to claim 1, wherein said second phase-locked loop has a range of synchronizing frequencies which is established depending on an error of said head position information.

4. A playback clock signal generating circuit according to claim 3, further comprising means for detecting the frequency of the output signal from said second voltage-controlled oscillator, and a control circuit for varying the frequency of the output signal from said first phase-locked loop depending on the frequency of the output signal from said second voltage-controlled oscillator.

5. A playback clock signal generating circuit according to claim 4, further comprising a voltage comparator for comparing a control voltage of said second voltage-controlled oscillator and a reference voltage, and producing an output signal representing the result of comparison, and a control circuit responsive to said output signal from said voltage comparator as a frequency-dividing-ratio changing signal for varying a frequency-dividing ratio of said variable frequency divider.

6. A playback clock signal generating circuit according to claim 4, further comprising a counter for measuring the period of said second signal outputted from said second voltage-controlled oscillator and outputting a count indicative of the measured period as a frequency-dividing-ratio changing signal for varying a frequency-dividing-ratio of said variable frequency divider.

7. A playback clock signal generating circuit for generating a playback clock signal from a data signal and a head position information, said playback clock signal being in synchronization with said data signal, said data signal being read and reproduced by a head from data written on a disk at a frequency selected from a plurality of frequencies which varies stepwise, said head position information being indicative of a radial position of the head which moves radially over the disk during disk read/write operations as the disk is being rotated at a constant speed, said playback clock signal generating circuit comprising:

a first phase-locked loop for outputting a first signal having a frequency variable in a predetermined frequency step depending on the head position information; and a second phase-locked loop for outputting a playback clock signal in response to the reproduced data signal and said first signal, wherein said second phase-locked loop includes a second voltage-controlled oscillator for outputting a second signal;

a mixer for frequency converting said second signal with said first signal to output said playback clock signal;

a second phase comparator responsive to the reproduced data signal and the playback clock signal outputted from said mixer; and a second low-pass filter connected between said second phase comparator and said second voltage-controlled oscillator.

8. A playback clock signal generating circuit according to claim 7, wherein said first phase-locked loop comprises:

a first voltage-controlled oscillator for outputting said first signal;

a variable frequency divider for varying a frequency-dividing number depending on said head position information and frequency-dividing said first signal with the varied frequency-dividing number;

a reference oscillator for outputting a reference signal having a frequency equal to said predetermined frequency step;

a first phase comparator responsive to an output signal from said variable frequency divider and said reference signal, for detecting the phase difference therebetween; and a first low-pass filter connected between said first phase comparator and said first voltage-controlled oscillator.

9. A playback clock signal generating circuit according to claim 7, wherein said first phase-locked comprises:

frequency-converting means for shifting the frequency of said first signal by a predetermined frequency;

a variable frequency divider for varying a frequency-dividing number depending on said head position information and frequency-dividing an output signal from said frequency-converting means with the varied frequency-dividing number;

a first phase comparator responsive to an output signal from said variable frequency divider and said reference signal, for detecting the phase difference therebetween; and a first low-pass filter connected between said first phase comparator and said first voltage-controlled oscillator.

10. A playback clock signal generating circuit according to claim 7, wherein said second phase-locked loop further includes pulse generating means for generating pulses at a frequency which is the same as an output signal from said second phase comparator, said pulses each having a duration in a predetermined proportion with respect to the period of the playback clock signal, said second low-pass filter comprising means for filtering a signal representative of the difference between the output signal from said second phase comparator and an output signal from said pulse generating means.

11. A playback clock signal generating circuit according to claim 7, wherein said second phase-locked loop has a range of synchronizing frequencies which is established depending on an error of said head position information.

12. A playback clock signal generating circuit according to claim 11, further comprising means for detecting the frequency of the output signal from said second voltage-controlled oscillator, and a control circuit for varying the frequency of the output signal from said first phase-locked loop depending on the frequency of the output signal from said second voltage-controlled oscillator.

13. A playback clock signal generating circuit according to claim 12, further comprising a voltage comparator for comparing a control voltage of said second voltage-controlled oscillator and a reference voltage, and producing an output signal representing the result of comparison, and a control circuit responsive to said output signal from said voltage comparator as a frequency-dividing-ratio changing signal for varying a frequency-dividing-ratio of said variable frequency divider.

14. A playback clock signal generating circuit according to claim 12, further comprising a counter for measuring the period of said second signal outputted from said second voltage-controlled oscillator and outputting a count indicative of the measured period as a frequency-dividing-ratio changing signal for varying a frequency-dividing ratio of said variable frequency divider.

* * * * *